(12) United States Patent
Lee et al.

(10) Patent No.: US 6,350,989 B1
(45) Date of Patent: Feb. 26, 2002

(54) WAFER-FUSED SEMICONDUCTOR RADIATION DETECTOR

(75) Inventors: Edwin Y. Lee; Ralph B. James, both of Livermore, CA (US)

(73) Assignee: Sandia National Laboratories, Livermore, CA (US)

( * ) Notice: Subject to any disclaimer, the term of this patent is extended or adjusted under 35 U.S.C. 154(b) by 0 days.

(21) Appl. No.: 09/298,685

(22) Filed: Apr. 23, 1999

(51) Int. Cl.[7] .................. H01L 31/0224; G01T 1/24
(52) U.S. Cl. ..................... 250/370.01; 250/370.13; 250/370.12; 257/428
(58) Field of Search ............... 250/370.01, 370.13, 250/370.12, 370.06; 257/428, 429, 431

(56) References Cited

U.S. PATENT DOCUMENTS

| | | | |
|---|---|---|---|
| 5,677,539 A | 10/1997 | Apotovsky et al. | 250/370.13 |
| 6,069,360 A * | 5/2000 | Lund | 250/370.01 |
| 6,175,120 B1 * | 1/2001 | McGregor et al. | 250/370.13 |

OTHER PUBLICATIONS

Luke, P.N., "Single–polarity charge sensing in ionization detectors using coplanar electrodes," Appl. Phys. Lett. vol. 65, No. 22 Nov. 1994 p. 2884–2886.
Lee, E. Y., et al. "Device Simulation of an Unipolar Gamma–Ray Detector" Mat. Res. Soc. Symp. Proc, vol. 487, 1998, p. 537–543.

* cited by examiner

*Primary Examiner*—Georgia Epps
*Assistant Examiner*—Richard Hanig
(74) *Attorney, Agent, or Firm*—L. E. Carnahan; T. P. Evans

(57) ABSTRACT

Wafer-fused semiconductor radiation detector useful for gamma-ray and x-ray spectrometers and imaging systems. The detector is fabricated using wafer fusion to insert an electrically conductive grid, typically comprising a metal, between two solid semiconductor pieces, one having a cathode (negative electrode) and the other having an anode (positive electrode). The wafer fused semiconductor radiation detector functions like the commonly used Frisch grid radiation detector, in which an electrically conductive grid is inserted in high vacuum between the cathode and the anode. The wafer-fused semiconductor radiation detector can be fabricated using the same or two different semiconductor materials of different sizes and of the same or different thicknesses; and it may utilize a wide range of metals, or other electrically conducting materials, to form the grid, to optimize the detector performance, without being constrained by structural dissimilarity of the individual parts. The wafer-fused detector is basically formed, for example, by etching spaced grooves across one end of one of two pieces of semiconductor materials, partially filling the grooves with a selected electrical conductor which forms a grid electrode, and then fusing the grooved end of the one semiconductor piece to an end of the other semiconductor piece with a cathode and an anode being formed on opposite ends of the semiconductor pieces.

14 Claims, 4 Drawing Sheets

WAFER-FUSED SEMICONDUCTOR RADIATION DETECTOR

The United States Government has rights in this invention pursuant to Contract No. DE-AC04-94AL85000 between the United States Department of Energy and the Sandia Corporation for the operation of the Sandia National Laboratories.

BACKGROUND OF THE INVENTION

The present invention relates to radiation detectors, particularly to semiconductor radiation detectors, and more particularly to wafer-fused semiconductor radiation detectors wherein an internal electrically conductive grid is located between ends of a pair of fused semiconductor pieces, and to a method for fabricating same.

Various types of radiation detectors have been developed for detecting gamma-rays and x-rays, among which are the planar semiconductor radiation detectors. Semiconductor radiation detectors generally operate by absorbing a quantum of gamma-ray or x-ray radiation and by converting the radiation energy into a number of electron-hole pairs that is proportional to the absorbed energy. After the conversion, the motion of the electrons and holes induce electrical signals on the detector electrodes. The electrical signals are also proportional to the energy of the absorbed radiation. Hence, by using a semiconductor radiation detector, one can detect gamma-ray and x-ray radiation and measure its energy spectrum.

The conventional planar semiconductor radiation detector is basically composed of a semiconductor material having a cathode on one surface and an anode on the opposite surface. A positive bias voltage is applied to the anode and a negative bias voltage is applied to the cathode. As x-rays or gamma-rays pass through the semiconductor material, electrons and holes are formed, and electrical signals are generated, and thus the energy of x-ray or gamma-ray radiation on the semiconductor material can be measured.

The conventional planar semiconductor radiation detector does not function well due to the poor electrical transport properties of the holes. Many of the common radiation detectors are made from CdZnTe or GaAs, with a cathode and anode made, for example, of gold, and for these semiconductors, the electrical signal due to the holes is typically much smaller than the electrical signal due to the electrons. These effects are due to the slower motion of the holes and greater probability of trapping of the holes within these materials. Because the total electrical signal is a sum of the signal due to the electrons and the holes, the signal due to the holes complicates the signal analysis and results in poor energy resolution and low efficiency for the detector.

The planar semiconductor radiation detector also suffers from a position dependence on the signal. For example, a signal due to electrons originating from radiation absorbed near the cathode will be larger than a signal originating from near the anode. Thus, the conventional planar semiconductor radiation detectors suffer from both poor electrical transport properties of the holes and from a position dependence of the signal.

Recent efforts have been directed to improve the energy resolution of the planar semiconductor radiation detectors and also to lessen the dependence of the signal on the position of the radiation absorption, and thus allow one to isolate the electrical signal due to the motion of electrons. These improved approaches are referred to as "electron-only devices" and have shown to give superior energy resolution for x-ray and gamma-ray radiation over the conventional planar semiconductor radiation detectors. The "electron-only devices" are exemplified by P. N. Luke, "Single-polarity charge sensing in ionization detectors using coplanar electrodes," Appl. Phys. Lett. 65 (22), Nov. 28, 1994; E. Y. Lee, et al., "Device Simulation of an Unipolar Gamma-Ray Detector," Mat. Res. Soc. Symp. Proc., 487, p. 537 (1998), U.S. Pat. No. 5,677,539, issued Oct. 14, 1997 to B. Apotovsky, et al., U.S. application Ser. No. 09/075,419 filed May 8, 1998, entitled, "Method and Apparatus for Electron-Only Radiation Detectors from Semiconductor Materials" by Lund, et al., now U.S. Pat. No. 6,069,360, and U.S. application Ser. No. 09/075,351 filed May 8, 1998, entitled, "High Resolution Ionization Detector and Array of Such Detectors" by McGregor, et al. now U.S. Pat. No. 6,175,120. These "electron-only devices" place a third metallic electrode, called a grid, on the surface of the detector near the anode to electrostatically shield the anode from the signal originating between the grid and the cathode. In these devices, all the signals from the anode originates from a motion of the electrons and holes moving between the anode and the grid. Since the electrons move toward the anode while the holes move away from the anode toward the cathode, due to their polarities, the signal on the anode will be dominated by the motion of the electrons. Furthermore, the signal will have much less position dependence, since electron trapping between the grid and anode will be unlikely.

In an "electron-only device" one can characterize the space between the grid and the cathode as a detection volume and the region between the grid and the anode as the measurement volume. Ideally, all radiation absorbed in the detection volume would give rise to electrical signals due only to the motion of the electrons in the measurement volume. However, there are several imperfections associated with the prior art of the "electron-only" detector, which are:

1. For the grid to shield the anode, the grid can not be placed too close to the anode. This decreases the measurement volume of the detector and therefore the radiation detection efficiency of the detector.

2. Many of the electrons created between the grid and the cathode are collected by the grid and produce no signal on the anode. Hence, these detectors have dead regions where no signals can be detected, leading to a loss of detector efficiency.

3. The internal electric field of the detector is highly non-uniform, due to the placement of the external grid. The electric field is uniform only very close to the cathode and the anode. The non-uniformity of the electric field causes variation in the charge collection time of the electrons. Since electron trapping does occur in the detector, this non-uniformity in the electric field results in variation of the signal strength with the position of the x-ray and gamma-ray absorption event, and hence in loss of the energy resolution. Attempts at correcting for the electron trapping by trying to deduce the position of the original radiation absorption are difficult due to the non-uniform internal electric field. This is commonly attempted by monitoring of the cathode signal and using it to correct the anode signal with electronic circuits external to the detector.

Another type of prior art radiation detectors utilize a grid called the Frisch grid. This type of detector contains a gas at a high pressure, and the Frisch grid comprises a metal mesh located between the cathode and the anode. The Frisch grid gives electron-only behavior and it has been the inspiration for a new class of electron-only detectors based on semiconductor materials. However, obviously one can not place a metal mesh through a solid semiconductor and hence it is not possible to directly implement the idea of the Frisch grid for semiconductor radiation detectors. Also, it is not possible to grow a metal mesh and then cover it up with a good quality semiconductor, since the resulting semiconductor overlayer always has poor electrical characteristics and low transmission through the interface, due to difficulties in the growth process. Simply pressing a metal mesh between two semiconductors does not make them a single piece, because in this device, electrons must cross the interface without becoming trapped by defects.

However, it has been recently discovered that, by applying high pressure and high temperature uniformly, it is possible to "bond" two clean semiconductor pieces or wafers together, without any glue, to form good interfaces. See Z. L. Leau, et al., Appl. Phys. Let. 56,737 (1990). This process is known as wafer bonding or wafer fusion. Wafer bonding has been successfully demonstrated in such semiconductor systems as GaAs/InP, GaN/InP, InGaAsP/Si, InP/SiO$_2$/InP, LiTaO3/Si, Si/In(Sb), Si/SiO$_2$, and LiTaO$_3$/Si. See above referenced Z. L. Lain, et al.; Y. H. Lo, et al., Appl. Phys. Lett. 62,1038 (1993); A. R. Hawkins, et al., Appl. Phys. Lett. 68, 3692 (1996); R. K. Sink, et al., Appl. Phys. Lett., 68 (15), p. 2147 (1996); and F. A. Kish, et al., Electronic Letters 30, 1790 (1994).

By using wafer fusion, it is possible to put an electrically conductive grid between two semiconductors and bond them together to make the present invention, which is a wafer-fused semiconductor radiation detector (WAFUSRAD), and which is a direct analog of a Frisch grid gas detector, but using semiconductor materials and the wafer bonding technology. The WAFUSRAD of the present invention largely removes the above-referenced three imperfections of the previously known electron-only devices based on semiconductors, resulting in superior energy resolution and radiation detection efficiency. In addition, this detector has all the virtues of an electron-only device, exploiting the excellent transport properties of electrons over holes and having signals. That are independent of the position of interaction. Basically, the WAFUSRAD of the present invention utilizes an electrically conductive grid adjacent ends of two semiconductor pieces, with the electrical conductor grid located in grooves in the end of one of the semiconductor pieces.

SUMMARY OF THE INVENTION

It is an object of the present invention to provide an improved semiconductor radiation detector.

A further object of the invention is to provide a semiconductor radiation detector which substantially overcomes the imperfections of the known electron-only detectors.

A further object of the invention is to provide a semiconductor radiation detector that is a direct analog of a Frisch grid detector, but using wafer-fused semiconductor pieces with an electrically conductive grid formed in one of the semiconductor pieces.

Another object of the invention is to provide a wafer-fused semiconductor radiation detector.

Another object of the invention is to provide a semiconductor radiation detector which incorporates an internal electrically conductive grid adjacent ends of a pair of wafer-fused semiconductor pieces.

Another object of the invention is to provide a semiconductor radiation detector wherein an electrically conductive grid is formed in grooves in one end of a semiconductor piece and that piece is wafer-fused to another semiconductor piece.

Another object of the invention is to provide an internal electrically conductive grid for a semiconductor radiation detector wherein the semiconductor material of the detector may consist of two pieces of the same or different materials, of the same or different thickness, and with the conductor grid composed of a metal, a variety of different metals, heavily doped semiconductors, superconductors, a conductive polymer, or any other electrical conductor, or combination thereof.

Another object of the invention is to provide a fabrication technique for producing a semiconductor radiation detector having an internal electrical conductor grid which functions as a Frisch grid.

Other objects and advantages of the present invention will become apparent from the following description and accompanying drawings. The present invention employs wafer fusion to insert an electrically conductive grid between two semiconductor pieces, one having a cathode and the other having an anode. The thus formed wafer-fused semiconductor radiation detector has an internal electrical conductor grid, which functions like the commonly known Frisch grid radiation detector. The electrically conductive grid is formed, for example, by etching spaced grooves across an end of a semiconductor piece, partially filling the grooves with an electrical conductor, and bonding the grooved end of the semiconductor piece to another semiconductor piece using the wafer fusion technique. The electrical conductor grid may be composed of any suitable electrical conductor, as above, and the semiconductor pieces may be of the same or different materials, and may have the same or different thickness and/or width. The conductor should have an electrical conductivity high enough to prevent significant voltage drop across members of the grid. This is important since such a condition would likely necessitate attaching a number of external electrodes to the grid at different locations to ensure that all grid members maintain the same electrical potential.

The detector of the present invention substantially overcomes the imperfections of the prior known electron-only detectors but exploits all the virtues of an electron-only detector; namely, the excellent transport properties of electrons over holes, and the position independent signal. The detector of this invention is a direct analog of a Frisch grid detector, but using semiconductor material, and wafer bonding technology.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

The present invention is directed to a wafer-fused semiconductor radiation detector which incorporates an internal electrically conductive grid. The semiconductor radiation detector of this invention functions almost exactly like the commonly used Frisch grid radiation detector. The detector is fabricated, for example, by forming grooves in an end of a piece of semiconductor material which contain an electrically conductive material and then bonding an end of another piece of semiconductor material to the grooved end of the first piece. In the formation of the detector two different semiconductor materials of different sizes may be used, and the grid conductor may be selected from a wide range of metals, combinations of different metals, heavily doped semiconductors, superconductors, a conductive polymer, or any other electrical conductor, or combination thereof, in order to optimize the detector performance, without being constrained by structural dissimilarity of the individual parts. Superior energy resolutions, radiation detection sensitivity, and flexibility in detector design are provided by the present invention. These expectations have been confirmed by computer modeling and simulations of the wafer-fused semiconductor radiation detector (WAFUSRAD) of the present invention. The WAFUSRAD largely removes the above-referenced three imperfections of the previously known electron-only detectors based on semiconductors, and in addition has all the virtues of an electron-only detector, exploiting the excellent transport properties of electrons over holes and having a position independent signal.

Figure 1:
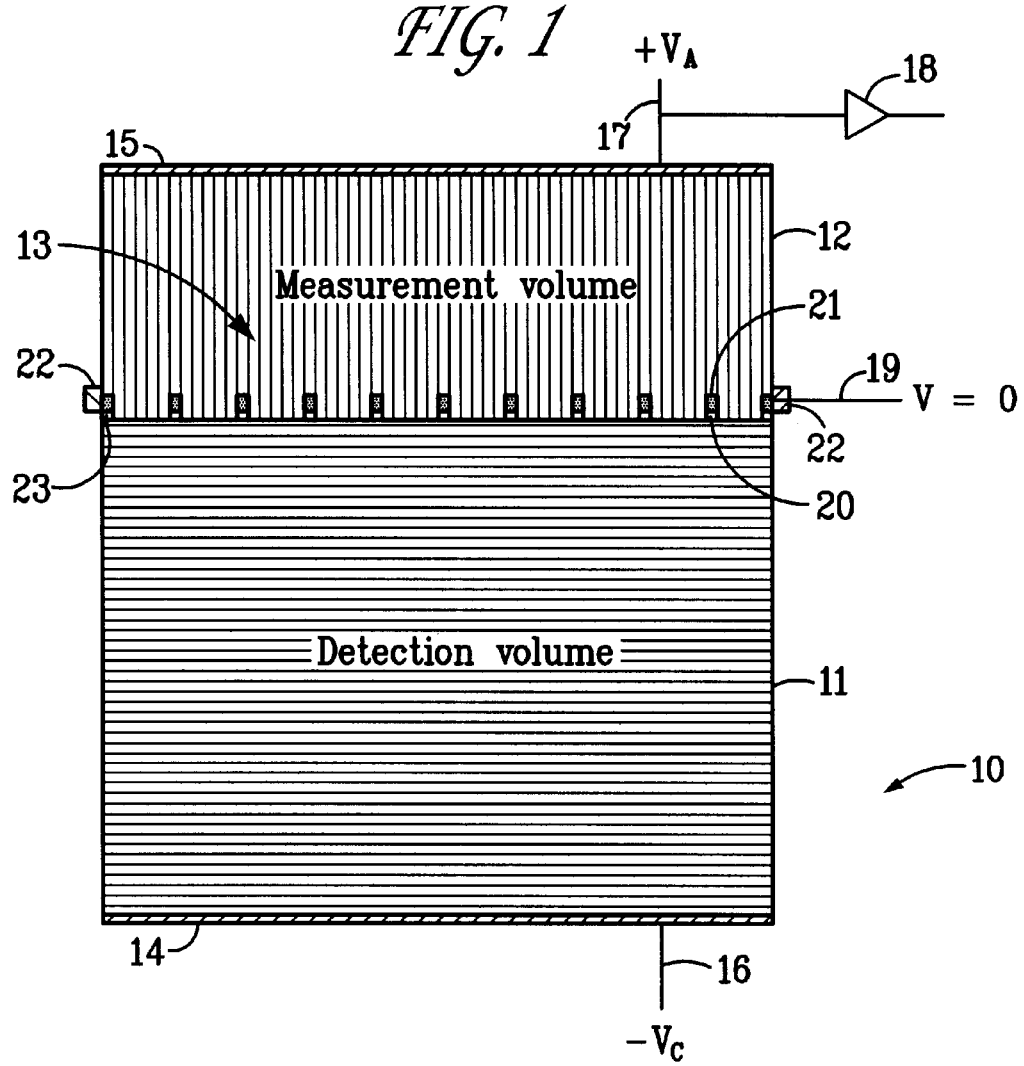
FIG. 1 is a top view of an embodiment of the wafer-fused semiconductor radiation detector of the present invention.

Referring now to the drawings, the WAFUSRAD consists of three main parts; namely two pieces of semiconductor material and an electrically conductive grid, the grid being formed in one end of one of the semiconductor pieces and the two pieces bonded together by a wafer-fusing technique. As shown in FIG. 1 the detector, generally indicated by 10, comprises a first semiconductor piece 11, a second semiconductor piece 12, an electrically conductive grid 13, said semiconductor piece 11 having a cathode 14 and said semiconductor piece 12 having an anode 15. The cathode 14 is connected to a negative bias voltage, as indicated at 16, and the anode 15 is connected to a positive bias voltage indicated at 17, and is connected to a charge amplifier 18. The conductive grid 13 is maintained at a zero voltage as indicated at 19. In this embodiment semiconductor piece 11 has a volume much larger than that of semiconductor piece 12. For example, piece 11 is 5×5×4 mm$^3$ and piece 12 is 5×5×1 mm$^3$. Semiconductor piece 11 is used to interact with gamma-ray or x-ray radiation, and the volume thereof is referred to as a detection volume, as indicated by legend, and semiconductor piece 12 is used to measure electrical signals as electrons created by the incident radiation quantum travel from the grid 13 to the anode 15, and the volume thereof is referred to as a measurement volume, is indicated by legend. Semiconductor piece 12, instead of being 1 mm thick, can be considerably thinner, down to a few microns (1000 $\mu$m to 1 $\mu$m). The grid 13 consists of an array of trenches or grooves 20 etched on the semiconductor piece 12 and an electrical conductor 21 partially fills the trenches 20 so as to define an internal electrically conductive mesh. In the embodiment of FIG. 1, the array consists of parallel trenches 20 spaced with a period of 0.5 mm, and with a width of 0.1 mm and length or depth of 0.2 mm. Note that the electrical conductor 21 only partially fills the trenches 20. The trenches can be shallower and narrower (such as 0.1 $\mu$m deep and 1 $\mu$m wide). An external electrode indicated at 22 extends over the surface of the trenches 20 and in electrical contact with the electrical conductor 21 in each of trenches 20, and has not been shown extending over the trenches 20 in FIG. 1 to enable illustration of the trenches 20 and electrical conductor 21 therein, but is partially shown in FIG. 2B. The electrode 22 allows biasing of the electrically conductive mesh and completes the grid 13. As described hereinafter with respect to FIGS. 2A and 2B, the semiconductor pieces 11 and 12, after the formation of the electrically conductive grid 13, are bonded together by wafer fusion by applying high pressure and high temperature uniformly to at least the ends of the pieces 11 and 12 to bond the pieces together, as known in the art. Due to the electrical conductor 21 only partially filling the trenches 20, air as indicated at 23 is allowed to pass therethrough.

Figure 2A:
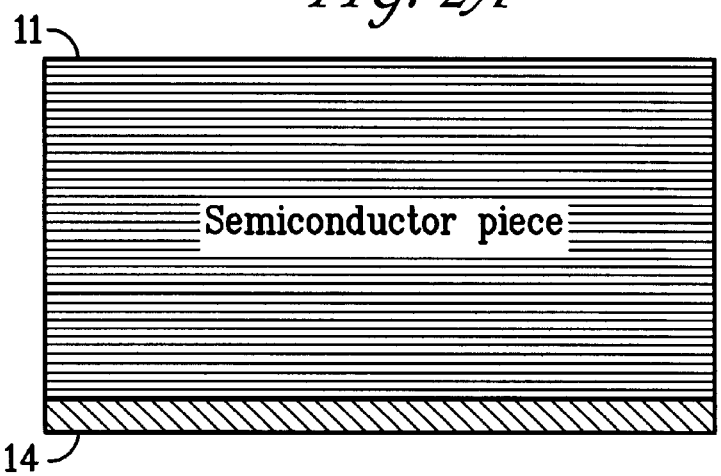
FIGS. 2A and 2B illustrate separate components of the detector of FIG. 1 prior to wafer-bonding of the components, with FIG. 2B greatly enlarged.
Figure 2B:
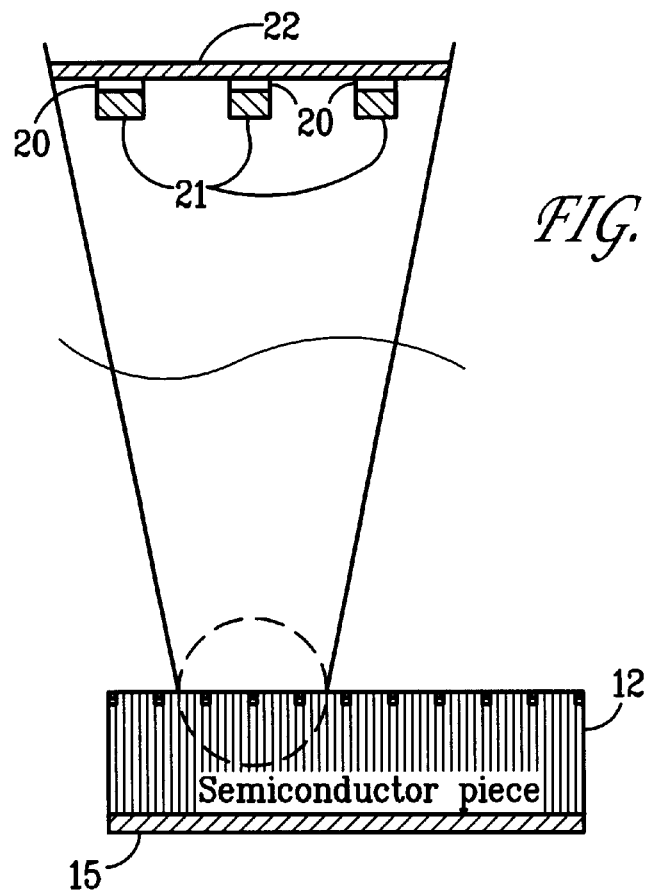

Referring now to FIGS. 2A and 2B, the semiconductor piece 11 as shown in FIG. 2A is an as-grown piece of semiconductor material that is cut and mechanically polished. The semiconductor piece 12, shown enlarged in FIG. 2B has trenches 20 etched, for example, by using a photoresist pattern and appropriate chemical etching to etch the semiconductor material and remove the surface oxide. For example, if the piece 12 is composed of CdZnTe, a Br/Methanol etchant with a 5% Br solution gives an etch rate of a few microns (1 $\mu$m to 5 $\mu$m) per minute. The trenches 20 can also be formed using many different etchants or dry etching techniques, depending on the composition of the semiconductor piece 12.

After etching of the trenches 20, a thin layer (0.01 $\mu$m to 10 $\mu$m) of electrical conductor 21, such as Pt, Au, Cu, Al, In, W, or any other suitable electrically conductive material is evaporated to partially fill the trenches 20. The photoresist is then removed, leaving trenches 20 partially filled with an array of electrically conducting members 21 which function as an electrically conducting mesh. Then both semiconductor pieces 11 and 12 are dipped in the etching solution, and the two pieces are pressed together, and raised in temperatures. For example, a pressure of 20 psia to 2000 psia and a temperature of 300° C. to 800° C. for a time period of 10 min. to 120 min. are utilized. The etchant removes the oxides on the semiconductor pieces 11 and 12. As the pieces are pressed together, the etching solution between the two pieces drains out through the trenches 20. This way, the removal of the oxides is immediately followed by the removal of the excess etching solution and further oxidation is halted. The higher temperature allow atomic rearrangement to take place, resulting in wafer bonding. The exact temperature, the duration, and the pressure depend on the semiconductor material properties. Approximately 600° C. and ½ hour at a pressure of 200 psia are typical for the wafer bonding of many compound semiconductor materials, which may include CdZnTe, CdTe, ZnTe, GaAs, In, and Si. After the pieces 11 and 12 are bonded, the external electrode 22 is formed over the trenches 20 and in contact with the electrically conductive members 21, as partially shown in FIG. 2B, with trenches 20 and electrical conductor members 21 thereunder shown in phantom.

Figure 3:
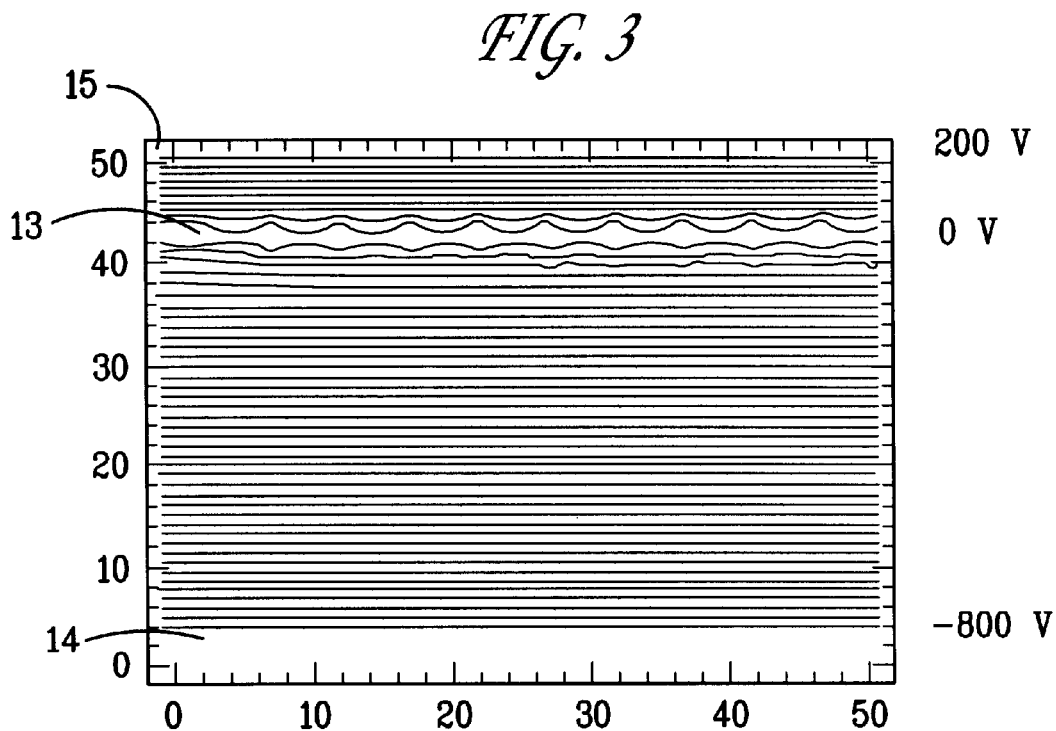
FIG. 3 illustrates the internal potential field of the FIG. 1 detector, taken from a plane passing through the middle of the detector.

The detector structure of FIG. 1 was modeled and simulated using a program called SandTMSP©$_{Sandia\ National\ Laboratories\ 1998}$, developed by Sandia National Laboratories, which is a three-dimensional multi-electrode device simulation program for semiconductor radiation detectors. FIG. 3 shows the potential field inside a WAFUSRAD, such as FIG.

1, calculated by solving the Laplace's equation using a finite-element method. As shown in FIG. 3, each contour line separates 20 volts, with FIG. 3 being taken from a plane passing through the middle of the detector. It can be seen from FIG. 3 that the potential field is uniformly spaced between the grid 13 and the cathode 14, and also between the grid 13 and anode 15. The field lines do not cross the grid 13, implying complete shielding of the detection volume (piece 11) from the measurement volume (piece 12) by the grid 13.

Figure 4:
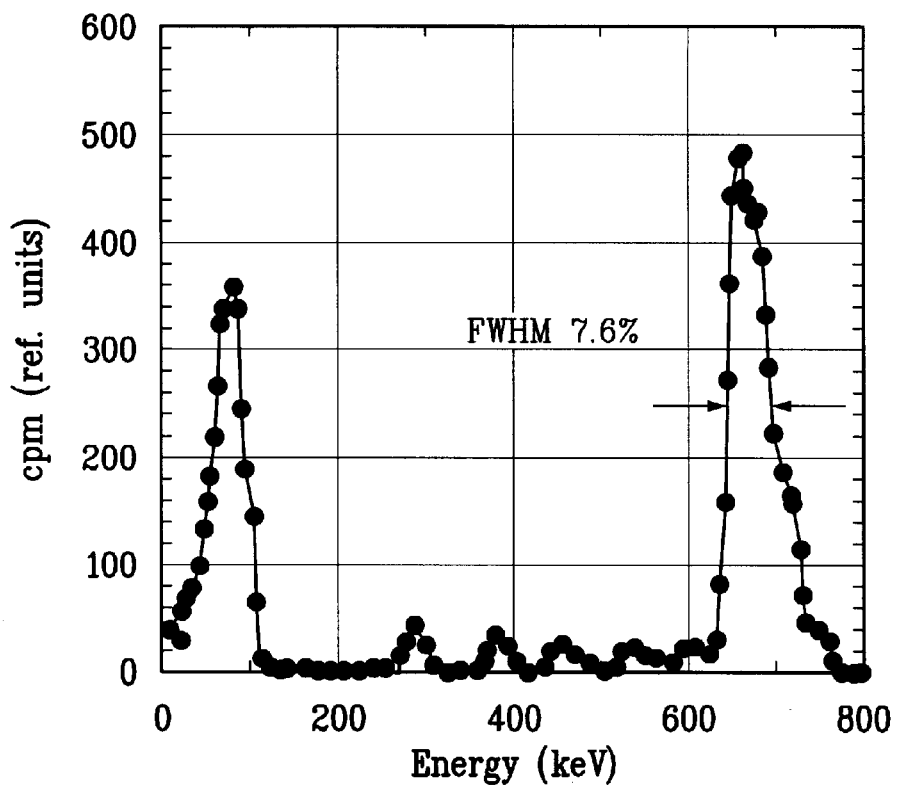
FIG. 4 graphically illustrates a simulated pulse height spectrum from a wafer-fused semiconductor radiation detector made in accordance with the present invention.

FIG. 4 graphically illustrates a simulated pulse height spectrum for the WAFUSRAD, such as shown in FIG. 1, calculated using realistic materials' parameters for CdZnTe. This is for irradiation from $^{137}$Cs gamma-ray radiation at 662 keV.

Figure 5:
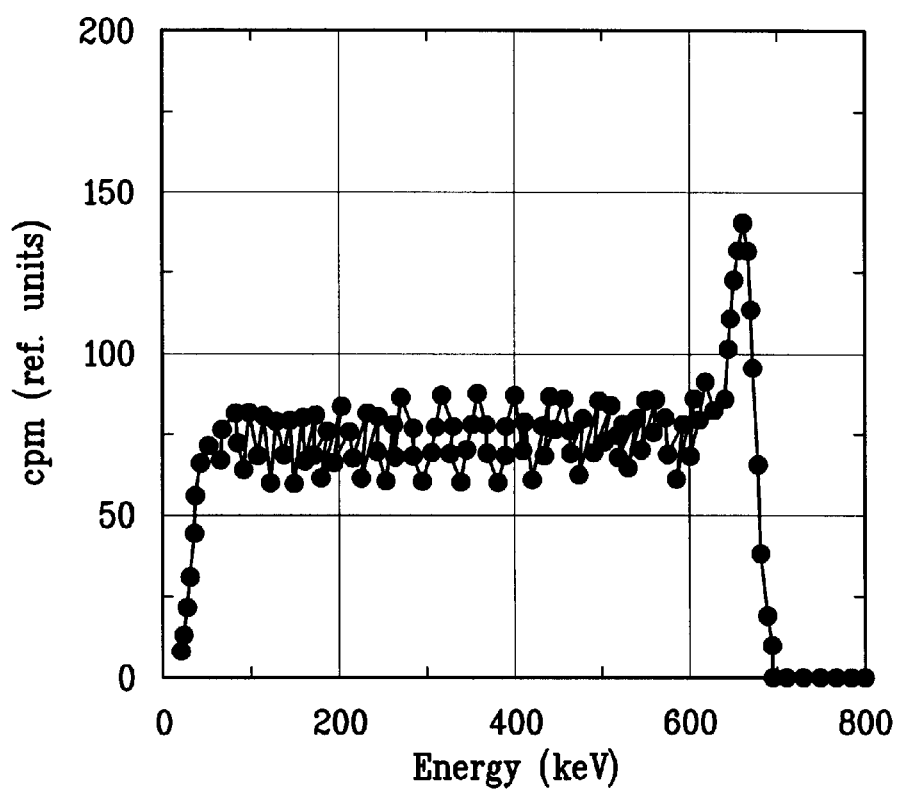
FIG. 5 graphically illustrates a simulated pulse height spectrum from conventional planar detector of similar dimensions to the detector from which the FIG. 4 graph was produced.
Figure 6:
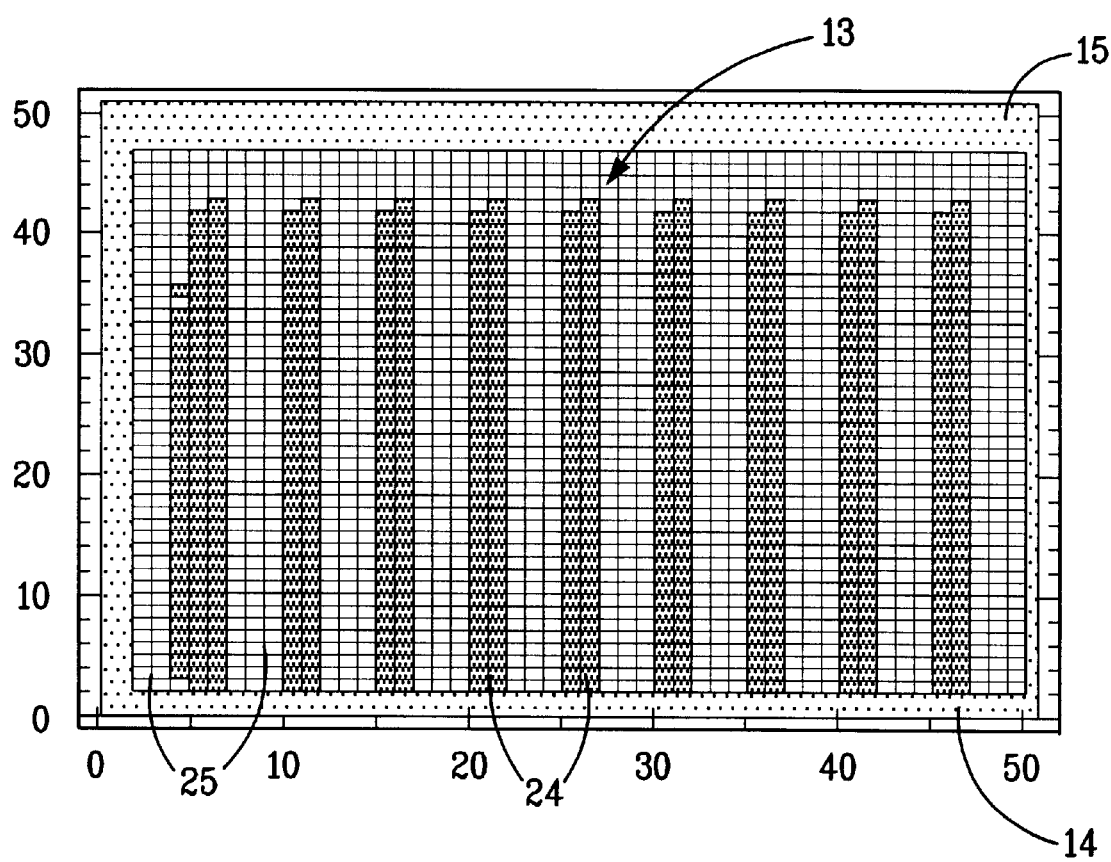
FIG. 6 is a charge induction map of a detector made in accordance with the present invention, and at a plane passing through the middle of the detector.

As shown for comparison in FIG. 5, there is a simulated pulse height spectrum from a conventional planar semiconductor detector 5×5×5 mm$^3$ in size, which is the same detector size as the FIG. 1 detector. The large high energy peak in FIG. 4 is due to a signal from the interaction of the incident radiation in the interaction or detection volume between the grid and the cathode, and the smaller low energy peak is due to a signal from the interaction of the incident radiation from the measurement volume between the grid and the anode and also from the dead regions of the detector. This is evident in the charge induction map of FIG. 6 for the detector of FIG. 1, that gives the response of the detector as a function of the position of the interaction of the radiation with the detector. Note that, as shown in FIG. 6, below each grid member, electrically conductive members 21 of FIG. 1, there is a dead region indicated at 24, because the electrons created in this region terminate at the grid and do not cross into the measurement region. Areas 25 of FIG. 6 correspond to areas giving large detector response, because the electrons cross into the measurement region. To minimize the dead region, one should minimize the area of grid elements, rather than a crisscrossing mesh, and making the width of the electrically conductive elements of the grid as thin and as far apart as possible. However, if the conductive elements of the linear array are too far apart, then the electrostatic field will have detrimental non-uniformities.

In examining the simulated pulse height spectrum, clearly the peak in the WAFUSRAD (FIG. 4) is much sharper and the signal counts under the peak are also much larger than that of the conventional detector (FIG. 5), meaning improved detector resolution and detector sensitivity. By increasing the electric field applied, the main peak would become even sharper.

There are several variants of the WAFUSRAD of FIG. 1, and four (4) such variants are set forth hereinafter. In one variant, the semiconductor piece 12 is made smaller than piece 11 so that the conductive trenches in the piece 12 are not entirely covered by the piece 11. This allows top contacting of the conductive trenches, which is considerably easier to do than side contacting.

In the second variant, instead of depositing an electrical conductor into the trenches in piece 12, these electrically conductive members are deposited on piece 11, then the two pieces 11 and 12 are aligned so that the electrical conductor fits into the trenches of piece 12. The advantages of this variant is that two different photoresists can be used, one for the conductor deposition and the other for the etching of the trenches.

In a third variant, different semiconductor materials are wafer-fused together. The semiconductor piece 11 defines the detection volume, and an ideal semiconductor material would have a large cross section for photoelectric interaction with gamma-rays. A good candidate, for example, is CdZnTe. The semiconductor piece 12 defines the measurement volume, and, ideally, no photoelectric interaction would take place. Since the photoelectric interaction is proportional to the 4th power of the atomic number of the constituent elements, low Z elements, such as Si, Ge, and Se, are preferred for the piece B.

In the fourth variant, the trenches can be in either piece 11 or piece 12, and then coated with an electrical conductor as described above.

In each of the variants as well as the embodiment of FIG. 1, the WAFUSRAD exploits the wafer-bonding technology to create an internal electrical conductor grid in semiconductor materials which functions as a Frisch grid which gives electron-only behavior.

In performance, WAFUSRAD should perform better than any existing detector. Because it is an electron-only detector, it is clearly superior to the conventional planar radiation detector having only two electrodes, in terms of both energy resolution and detection volume efficiency. In addition, the imperfections associated with the prior art of the electron-only devices are eliminated in the following way:

(1) The grid can be placed very close the anode, without decreasing its shielding capacity. This increases the measurement volume of the device and hence the detection efficiency of the device.

(2) The size of the dead region giving degraded detector response can be minimized by decreasing the area of the grid. This can be done by making the width of the grid as thin as possible. The spacing between the grid is maximized, while trying to maintain uniform electric field by not increasing it too much.

(3) The internal electric field of the device outside the grid region is nearly perfectly uniform because the grid is parallel to the cathode and the anode and placed internally. This means that, in any given plane within the detector parallel to the grid, the signal resulting from a x-ray or gamma-ray will be nearly identical, even in the presence of electron trapping. If the detector is oriented so that it operates with x-rays or gamma-rays incident perpendicular to the cathode or anode, then one fully exploits the uniformity of the internal electric field and the best energy resolution can be expected. In addition, the commonly used scheme to correct the electron signal from the anode using the signal from the cathode should work much better due to the uniformity of the electric field.

Hence, a clearly better performance is expected from WAFUSRAD, in comparison to the prior art of the electron-only devices.

The detector of the present invention can be used by industrial builders of x-ray and gamma-ray spectrometers for medical imaging, environmental monitoring, baggage handling, and materials sorting applications. The government can use the detector, for instance, to detect nuclear smuggling, safeguard dismantled nuclear materials, search for nuclear weapons, verify treaty compliance, locate unexploded ordnance, detect contraband drugs, perform forensic analyses, conduct x-ray astronomy, cleanup waste sites, and act as personal dosimeters.

It has thus been shown that the present invention provides an improved semiconductor radiation detector, which includes an internal electrically conductive grid which functions like the commonly used Frisch grid, but in a semiconductor material. The detector utilizes the advantages of the prior known electron-only detectors, but without the imperfections of the prior electron-only detectors, and utilized the known wafer-bonding or wafer-fusion technique to form an internal conductor grid within the semiconductor material. In addition, the detector of the present invention provides for flexibility in the design thereof, while providing superior energy resolution and radiation detection sensitivity.

While embodiments of the invention have been described and/or illustrated, with specific parameters and materials set forth to exemplify and teach the principle of the invention, such are not intended to be limiting. Modifications and changes may become apparent to those skilled in the art, and it is intended that the invention be limited only by the scope of the appended claims.

What is claimed is:

1. An improved semiconductor radiation detector, comprising:
    first and second pieces of semiconductor material, wherein said pieces comprise the same or different semiconductor materials;
    an electrically conductive grid located at least partially within a surface of either of said first or said second pieces of said semiconductor material, wherein said electrically conductive grid includes an array of spaced electrically conductive members comprising one or more materials selected from the group consisting of one or more metals, a heavily doped semiconductor material, a superconducting material, a conductive polymer, and combinations thereof; said members formed by ion implantation or by vapor deposition, said members located in and only partially filling an array of trenches in said semiconductor material, said first and second pieces fused together adjacent said electrically conductive grid to form a radiation detector body;
    a cathode mounted to a first external surface of said radiation detector body opposite said electrically conductive grid;
    an anode mounted to a second external surface of said radiation detector body opposite said electrically conductive grid; and
    an electrode in contact with said array of electrically conductive members.

2. The improved semiconductor radiation detector of claim 1, wherein said electrically conductive members are located entirely within said trenches.

3. The improved semiconductor radiation detector of claim 1, wherein said electrically conductive members are secured to another of said two pieces of semiconductor material, and said two pieces are aligned and fused together such that said electrically conductive members extend into said trenches in said one of said two pieces of semiconductor material.

4. The improved semiconductor radiation detector of claim 1, wherein said two pieces of semiconductor material each have the same width.

5. The improved semiconductor radiation detector of claim 1, wherein said two pieces of semiconductor material have different widths so that said array of electrically conductive members are partially exposed.

6. The improved semiconductor radiation detector of claim 1, wherein said two pieces of semiconductor material are each of a different composition.

7. The improved semiconductor radiation detector of claim 1, wherein said two pieces of semiconductor material are selected from the group consisting of CdZnTe, CdTe, GaAs, InP, and Si.

8. A semiconductor radiation detector, comprising:
    a semiconductor material comprising two pieces of the same or a different semiconductor material bonded together by wafer-fusion to form a fusion zone;
    a cathode;
    an anode; and
    an electrically conductive grid internally disposed in said semiconductor material intermediate said cathode and said anode and adjacent said fusion zone, said electrically conductive grid further including an array of spaced electrically conductive members located in grooves in one of said 2 pieces of said semiconductor material, said electrically conductive members being connected to a common conductive member.

9. The semiconductor radiation detector of claim 8, wherein said grooves in said semiconductor material are located in an end of one of said two pieces of semiconductor material, and wherein said electrically conductive members only partially fill said grooves.

10. The semiconductor radiation detector of claim 8, wherein said grooves are located in an end section of one of said two pieces of semiconductor material, and wherein said electrically conductive members are secured to an end section of another of said two pieces of semiconductor material.

11. The semiconductor radiation detector of claim 8, wherein said two pieces of semiconductor material are each composed of a different semiconductor material, and selected from the group consisting of CdZnTe, CdTe, GaAs, InP, and Si.

12. The semiconductor radiation detector of claim 8, wherein said one of said two pieces of semiconductor material has a area less than an area of another of said two pieces of semiconductor material.

13. The semiconductor radiation detector of claim 8, wherein said electrically conductive grid is formed from one or more metals, a heavily doped semiconductor material, a superconducting material, a conductive polymer, or a combination thereof.

14. A method for fabricating a wafer-fused semiconductor radiation detector comprising,
    providing two pieces of semiconductor material, with one piece secured to a cathode and the other piece secured to an anode,
    forming trenches in one end of either of said two pieces of semiconductor material,
    locating an electrical conductor in the thus formed trenches, providing an electrode in contact with the electrical conductor in the trenches, and bonding ends of the two pieces of semiconductor matter together by a wafer-fusion technique.

* * * * *